(12) United States Patent
Ishimoto

(10) Patent No.: US 6,460,091 B1
(45) Date of Patent: Oct. 1, 2002

(54) ADDRESS DECODING CIRCUIT AND METHOD FOR IDENTIFYING INDIVIDUAL ADDRESSES AND SELECTING A DESIRED ONE OF A PLURALITY OF PERIPHERAL MACROS

(75) Inventor: Satomi Ishimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/291,221

(22) Filed: Apr. 13, 1999

(30) Foreign Application Priority Data

Apr. 15, 1998 (JP) .......................... 10-104233

(51) Int. Cl.⁷ ............................... G06F 3/00
(52) U.S. Cl. .................... 710/1; 712/208; 712/124; 710/68
(58) Field of Search .................. 710/1, 7, 64, 131, 710/132, 5, 8, 15, 72, 124, 65, 68; 712/208, 209, 112, 242, 210; 714/42

(56) References Cited

U.S. PATENT DOCUMENTS

| | | | |
|---|---|---|---|
| 3,420,991 A | | 1/1969 | Ling |
| 4,603,405 A | | 7/1986 | Michael |
| 5,060,198 A | * | 10/1991 | Kowalski ............... 365/201 |
| 5,123,016 A | * | 6/1992 | Miiler et al. ............ 371/10.3 |
| 5,331,644 A | * | 7/1994 | Ishii et al. ............. 371/25.1 |
| 5,359,561 A | * | 10/1994 | Sakomura et al. ....... 365/201 |
| 5,394,373 A | * | 2/1995 | Kawamoto ............ 365/230.06 |
| 5,453,990 A | * | 9/1995 | Aoki et al. ............. 371/20.1 |
| 5,515,328 A | * | 5/1996 | De Ferron ............ 365/230.03 |
| 5,553,025 A | | 9/1996 | Haraguchi |

FOREIGN PATENT DOCUMENTS

| | | |
|---|---|---|
| DE | 3232215 | 8/1982 |
| JP | 59-60800 | 4/1984 |
| JP | 61-156746 | 7/1986 |
| JP | 63-116242 | 5/1988 |
| JP | 2-154177 | 6/1990 |
| JP | 4-68554 | 3/1992 |
| JP | 8-86836 | 4/1996 |
| JP | 10-19988 | 1/1998 |

* cited by examiner

Primary Examiner—Jeffrey Gaffin
Assistant Examiner—RiJue Mai
(74) Attorney, Agent, or Firm—Katten Muchin Zavis Rosenman (57) ABSTRACT

There is provided an address decoding circuit including (a) a first address decoder for practical use for decoding an address which is particular to an individual object, (b) a second address decoder for test use for decoding a constant address regardless of objects, and (c) a logic circuit receiving a selection signal and switching from decoding result transmitted thereto from the first address decoder to decoding result transmitted thereto from the second address decoder, and vice versa in accordance with the selection signal. The address decoding circuit selects decoding result of an address used for a test, which is particular to peripheral macros, in a test mode in accordance with the selection signal. Hence, when peripheral macros are mounted on different chips, it would be possible to use a common vector, even if an address for practical use is changed. This ensures reduction in steps of re-constructing test vector.

15 Claims, 5 Drawing Sheets

ADDRESS DECODING CIRCUIT AND METHOD FOR IDENTIFYING INDIVIDUAL ADDRESSES AND SELECTING A DESIRED ONE OF A PLURALITY OF PERIPHERAL MACROS

BACKGROUND OF THE INVENTION

1. Field of the Invention

The invention relates to an address decoding circuit and a method of address decoding, and more particularly to an address decoding circuit and a method of address decoding which are capable of identifying addresses and selecting a desired one of peripheral macros.

2. Description of the Related Art

Though peripheral macros are generally mounted on different devices, an address for practical use (hereinafter, referred to as "practical-use address") is not always common among such peripheral macros. Accordingly, it would be necessary to identify a practical-use address, and select a peripheral macro.

Figure 1:
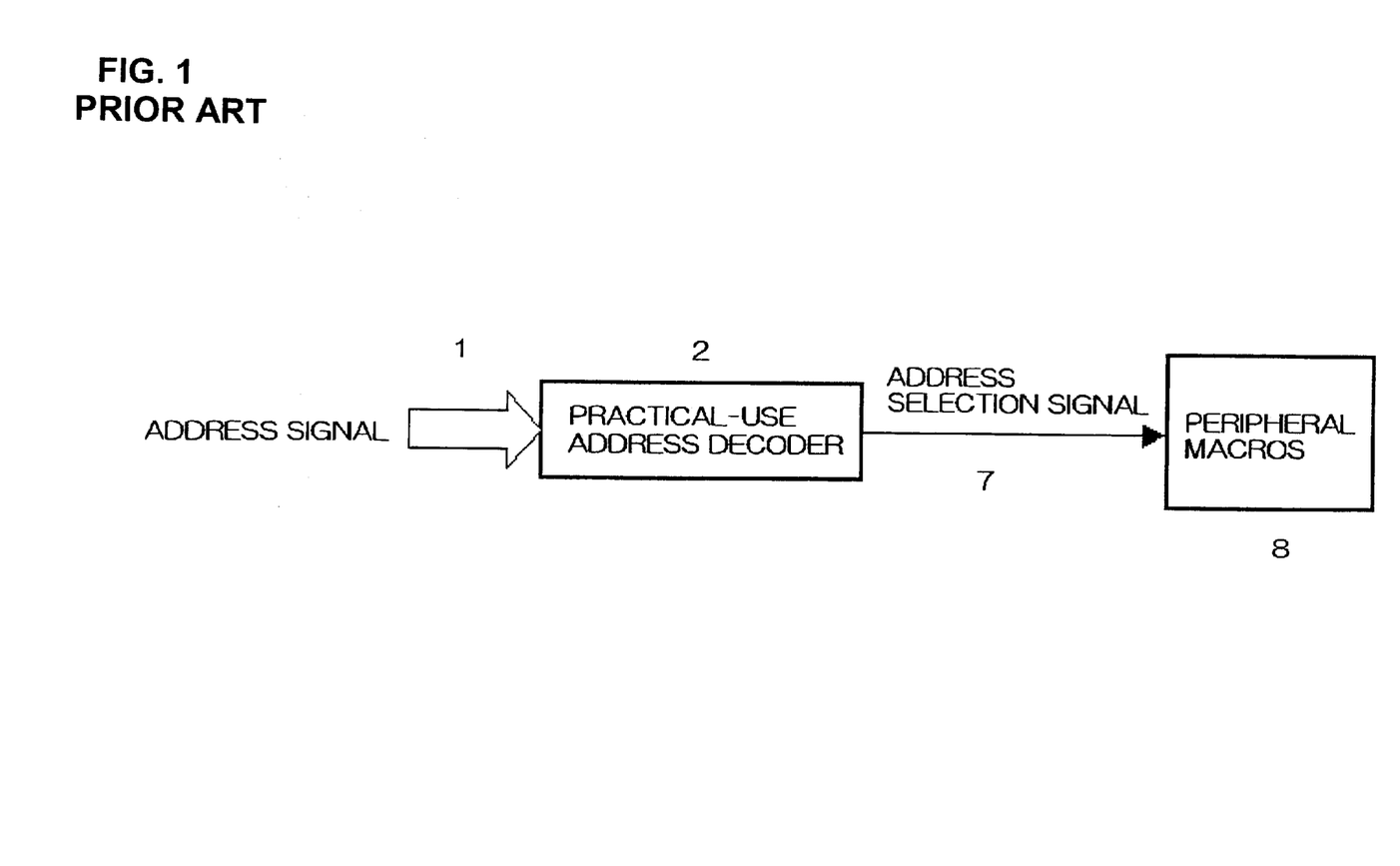
FIG. 1 is a block diagram of a conventional address decoding circuit.

FIG. 1 is a block diagram of an example of conventional address decoding circuits which select a peripheral macro through the use of a practical-use address.

The illustrated address decoding circuit is comprised only of a practical-use address decoder 2. The practical-use address decoder 2 receives an address signal 1 and transmits an address selection signal 7 to one of peripheral macros 8.

When peripheral macros were to be mounted on a chip, the address signal 1 was transmitted to the practical-use address decoder 2, an address was identified only in the practical-use address decoder 2, and a desired peripheral macro 8 was selected in accordance with the result of address identification.

When an address decoder is to be tested, test vector for a test mode is constructed in advance. A test for an address decoder is carried out through the use of the constructed test vector.

A common address decoder has been conventionally employed not only in a test mode, but also in practical use. As a result, there was a problem that test vector had to be re-constructed each time a practical-use address for individual devices is changed.

Apart from the conventional address decoding circuit illustrated in FIG. 1, Japanese Unexamined Patent Publications Nos. 61-156746 and 4-68554 have suggested address decoding circuits. However, the above-mentioned problem that test vector had to be re-constructed each time a practical-use address for individual devices is changed, remains unsolved in those address decoding circuits.

Japanese Unexamined Patent Publication No. 63-116242 has suggested a data processing apparatus including a plurality of functional blocks electrically connected in series. The suggested data processing apparatus selects one of functional blocks in accordance with a functional block selection signal.

However, since the suggested data processing apparatus includes only one address decoder, and identifies an address by means of the address decoder, the data processing apparatus is accompanied also with a problem that test vector has to be re-constructed each time a practical-use address is changed.

Japanese Unexamined Patent Publication No. 8-86836 has suggested a semiconductor integrated circuit device including first and second circuit blocks each performing certain function, a first input located between the first and second circuit blocks for receiving an output data signal from the first circuit block, a second input receiving a test data signal transmitted from outside in a test mode, an output node transmitting data signals to an input node and a test data output terminal of the second circuit block, and a selector transmitting the data signal provided to the second input in response to a test mode indicating signal, to an output.

The suggested semiconductor integrated circuit device solves the above-mentioned problem. That is, the semiconductor integrated circuit device has an advantage that it is not necessary to re-construct test vector, even if a practical-use address is changed. However, the semiconductor integrated circuit device is accompanied with another problem that since the device has to include a plurality of selectors, it would be quite difficult or almost impossible to make the device as a whole smaller in size.

Japanese Unexamined Patent Publication No. 2-154177 has suggested a module tester for testing a single chip on which a plurality of functional blocks is mounted. The tester selects a functional block to be tested in testing, and establishes a test mode in a test interface logic means equipped in the selected functional block. In response to establishment of the test mode, an interactive data bus on the chip is set on a bus interface unit by a bit. As a result, it will be necessary to re-construct a bus interface unit each time different functional blocks are to be tested.

However, in accordance with the suggested module tester, a test mode has to be established in the test interface logic means, and in addition, an interactive data bus has to be established for individual test. That is, a lot of complicated steps have to be carried out for practically performing a test in the module tester.

SUMMARY OF THE INVENTION

In view of the above-mentioned problems of the conventional address decoding circuits, it is an object of the present invention to provide an address decoding circuit which is capable of employing common test vector even if a practical-use address is changed, in the case that peripheral macros are mounted on a plurality of different chips, to thereby eliminate necessity of re-constructing test vector without having a complicated structure.

It is also an object of the present invention to provide a method of address decoding which method is capable of doing the same.

In one aspect, there is provided an address decoding circuit including (a) a first address decoder for practical use for decoding an address which is particular to an individual object, (b) a second address decoder for test use for decoding a constant address regardless of objects, and (c) a logic circuit receiving a selection signal and switching from decoding result transmitted thereto from the first address decoder to decoding result transmitted thereto from the second address decoder, and vice versa in accordance with the selection signal.

There is further provided an address decoding circuit including (a) a first address decoder receiving an address signal, comparing the thus received address signal to a certain address, and transmitting a first coincidence signal only when the address signal is coincident with the certain address, (b) a second address decoder receiving an address signal, comparing the thus received address signal to a certain address, and transmitting a second coincidence signal only when the address signal is coincident with the certain address, and (c) a selector receiving a selection signal, selecting one of the first and second coincidence signals in accordance with the received selection signal, and selecting one of a plurality of peripheral macros in accordance with the thus selected coincidence signal.

For instance, the first address decoder may be an address decoder for practical use for decoding an address which is particular to an individual object, and the second address decoder may be an address decoder for test use for decoding a constant address regardless of objects.

For instance, a binary signal having "0" and "1" is used as the selection signal.

There is still further provided an address decoding circuit including (a) a first address decoder receiving a first address signal, comparing the thus received first address signal to a certain address, and transmitting a first coincidence signal only when the first address signal is coincident with the certain address, (b) a second address decoder receiving the first address signal, comparing the thus received first address signal to a certain address, and transmitting a second coincidence signal only when the first address signal is coincident with the certain address, (c) a selector receiving a selection signal, selecting one of the first and second coincidence signals in accordance with the received selection signal, and transmitting the thus selected coincidence signal as a first address selection signal, (d) at least one third address decoder receiving a second address signal, decoding the thus received second address signal, and transmitting a second address selection signal, and (e) at least one logic circuit each receiving the first and second address selection signals, logically summing the first and second address selection signals, and selecting one of a plurality of peripheral macros in accordance with the result of logically summing the first and second address selection signals.

It is preferable that the number of the third address decoder(s) is equal to the number of register(s) equipped in each of the peripheral macros.

In another aspect, there is provided a method of address decoding, including the steps of (a) receiving an address signal, comparing the thus received address signal to a certain address, and transmitting a first coincidence signal only when the address signal is coincident with the certain address in a first address decoder, (b) receiving an address signal, comparing the thus received address signal to a certain address, and transmitting a second coincidence signal only when the address signal is coincident with the certain address in a second address decoder, (c) receiving a selection signal, and selecting one of the first and second coincidence signals in accordance with the selection signal, and (d) selecting one of a plurality of peripheral macros in accordance with the thus selected coincidence signal.

It is preferable that the steps. (a) and (b) are concurrently carried out.

There is further provided a method of address decoding, including the steps of (a) receiving a first address signal, comparing the thus received first address signal to a certain address, and transmitting a first coincidence signal only when the first address signal is coincident with the certain address in a first address decoder, (b) receiving the first address signal, comparing the thus received first address signal to a certain address, and transmitting a second coincidence signal only when the first address signal is coincident with the certain address in a second address decoder, (c) receiving a selection signal, selecting one of the first and second coincidence signals in accordance with the selection signal, and transmitting the thus selected coincidence signal as a first address selection signal, (d) receiving a second address signal, decoding the thus received second address signal, and transmitting a second address selection signal in a third address decoder, (e) logically summing the first and second address selection signals, (f) selecting one of a plurality of peripheral macros in accordance with the result of the step (e).

It is preferable that the step (d) is carried out in a plurality of the third address decoders, in which case, it is also preferable that each of a plurality of the third address decoders concurrently carried out the step (d).

It is preferable that the steps (a) and (b) are concurrently carried out.

It is also preferable that the steps (a ), (b) and (d) are concurrently carried out.

As mentioned above, the first or practical-use address decoder and the second or test-use address decoder are both employed in the present invention. The present invention makes it possible to establish test vector or test pattern through the use of a test address decoder to thereby use common test vector, even if a practical-use address is changed, in the case peripheral macros are mounted on a plurality of different chips.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 2:
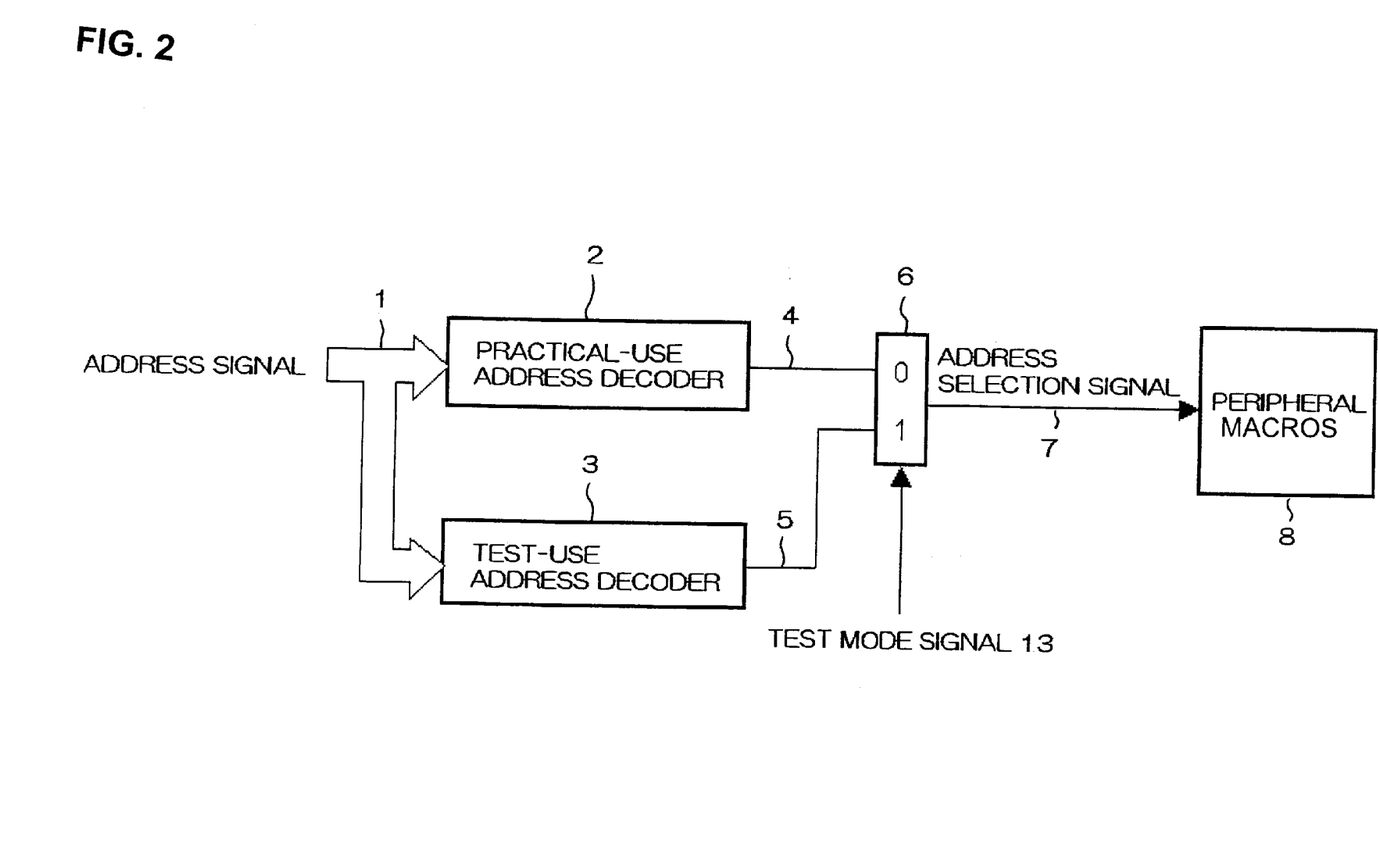
FIG. 2 is a block diagram of an address decoding circuit in accordance with the first embodiment.

FIG. 2 is a block diagram of an address decoding circuit in accordance with the first embodiment.

The address decoding circuit in accordance with the first embodiment is comprised of a first or practical-use address decoder 2 receiving an address signal through an address bus, comparing the thus received address signal to a certain address, and transmitting a first coincidence signal 4 only when the address signal is coincident with the certain address, a second or test-use address decoder 3 receiving an address signal through the address bus 1, comparing the thus received address signal to a certain address, and transmitting a second coincidence signal 5 only when the address signal is coincident with the certain address, and a selector 6 receiving the first coincidence signal 4, the second coincidence signal 5, and a test mode signal 13, selecting one of the first and second coincidence signals 4 and 5 in accordance with the received test mode signal 13, and transmitting the thus selected first or second coincidence signal 4 or 5 to peripheral macros 8 as an address selection signal 7.

The test mode signal 13 transmitted to the selector 6 is a binary signal having two values "0" and "1". The test mode signal 13 having a value "1" is indicative of a test mode, and the test signal 13 having a value "0" is indicative of modes other than the test mode.

Hereinbelow is explained an operation of the address decoding circuit illustrated in FIG. 2.

An address signal introduced into the practical-use address decoder 2 and the test-use address decoder 3 through the address bus 1 is compared to a certain address in each of the practical-use address decoder 2 and the test-use address decoder 3. The practical-use address decoder 2 and the test-use address decoder 3 transmit the first and second coincidence signals 4 and 5, respectively, only when the received address signal is coincident with the certain address.

The selector 6 selects the first coincidence signal 4 when the received test mode signal 13 has a value "0" indicative of modes other than a test mode, or the second coincidence signal 5 when the received test mode signal 13 has a value "1" indicative of a test mode, and transmits the thus selected coincidence signal 4 or 5 to the peripheral macros 8 as the address selection signal 7. Then, one of the peripheral macros 8 is selected in accordance with the thus transmitted address selection signal 7.

As mentioned so far, the address decoding circuit in accordance with the first embodiment selects decoding result transmitted from the test-use address decoder 3 and particular to the peripheral macros 8 in accordance with the test mode signal 13 in a test mode, and selects decoding result transmitted from the practical-use address decoder 2 and different from other decoding results in dependence on objects in a practical-use mode. As a result, it is possible to make access to the peripheral macros 8 with a constant address in a test mode, even if the practical-use address is changed.

Second Embodiment

Figure 3:
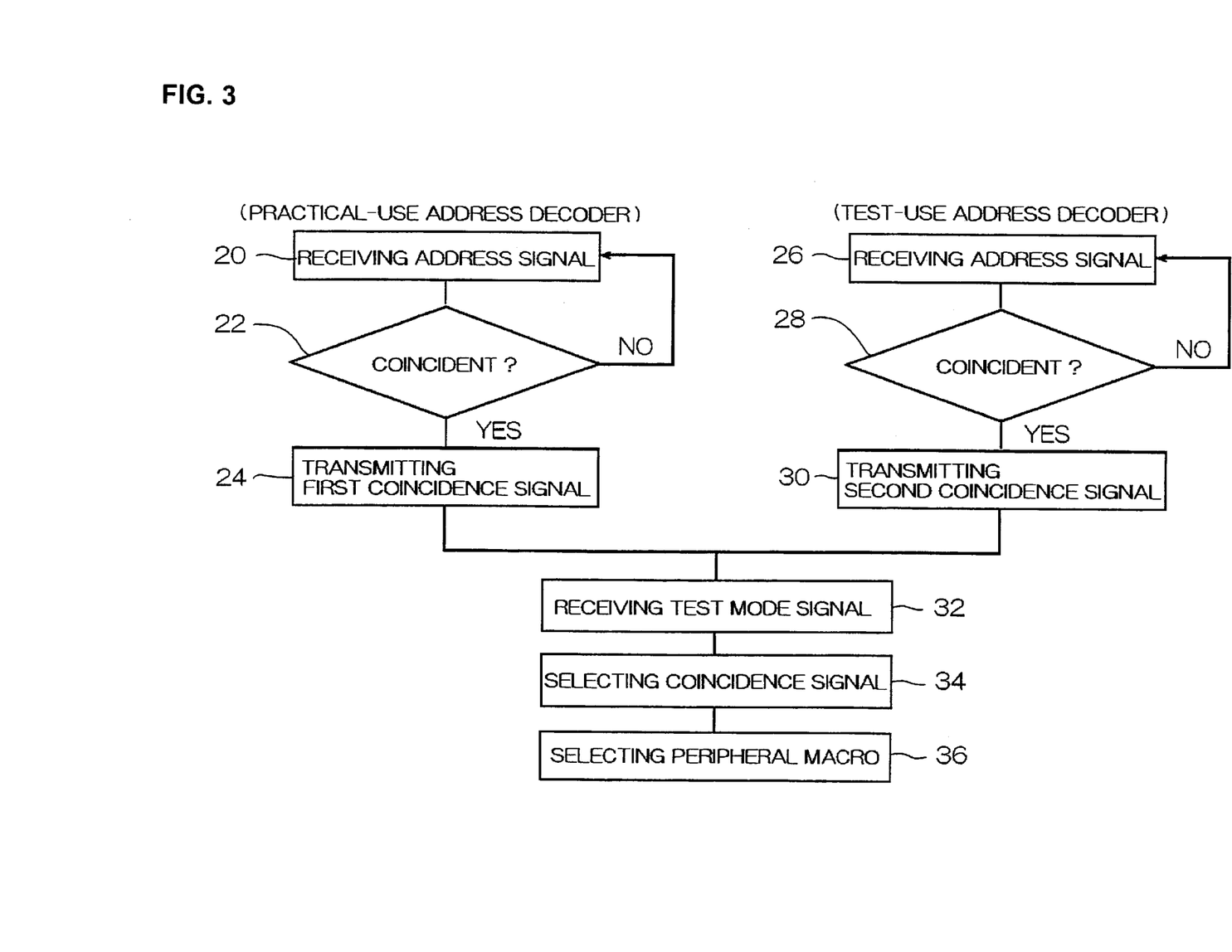
FIG. 3 is a flow chart of a method of address decoding in accordance with second embodiment.

FIG. 3 is a flow chart of a method of address decoding in accordance with the second embodiment.

First, as shown in step 20, an address signal is received in the practical-use address decoder 2 as the first address decoder.

Then, as shown in step 22, the practical-use address decoder 2 compares the received address signal to a certain address to determine whether they are coincident with each other.

If not (NO in step 22), comparison is ceased, and the practical-use address decoder 2 waits a next address signal.

If the received address signal is coincident with the certain address (YES in step 22), the practical-use address decoder 2 transmits the first coincidence signal 4, as shown in step 24.

The test-use address decoder 3 as the second address decoder carries out the same steps. Specifically, as shown in step 26, an address signal is received in the test-use address decoder 3 as the second address decoder.

Then, as shown in step 28, the test-use address decoder 3 compares the received address signal to a certain address to determine whether they are coincident with each other.

If not (NO in step 28), comparison is ceased, and the test-use address decoder 3 waits a next address signal.

If the received address signal is coincident with the certain address (YES in step 28), the test-use address decoder 3 transmits the second coincidence signal 5, as shown in step 30.

The steps 20, 22 and 24 carried out by the practical-use address decoder 2 and the steps 26, 28 and 30 carried out by the test-use address decoder 3 may be concurrently carried out. As an alternative, one of them may be carried out earlier than the other.

After receiving the first and second coincidence signals 4 and 5, the selector 6 receives the test mode signal 13 having a value "0" or "1", as shown in step 32.

As shown in step 34, the selector 6 selects the first coincidence signal 4 when the received test mode signal 13 has a value "0", and the second coincidence signal 5 when the received test mode signal 13 has a value "1".

The thus selected coincidence signal 4 or 5 is transmitted to the peripheral macros 8 as the address selection signal 7. In accordance with the address selection signal 7, a desired peripheral macro is selected, as shown in step 36.

Third Embodiment

Figure 4:
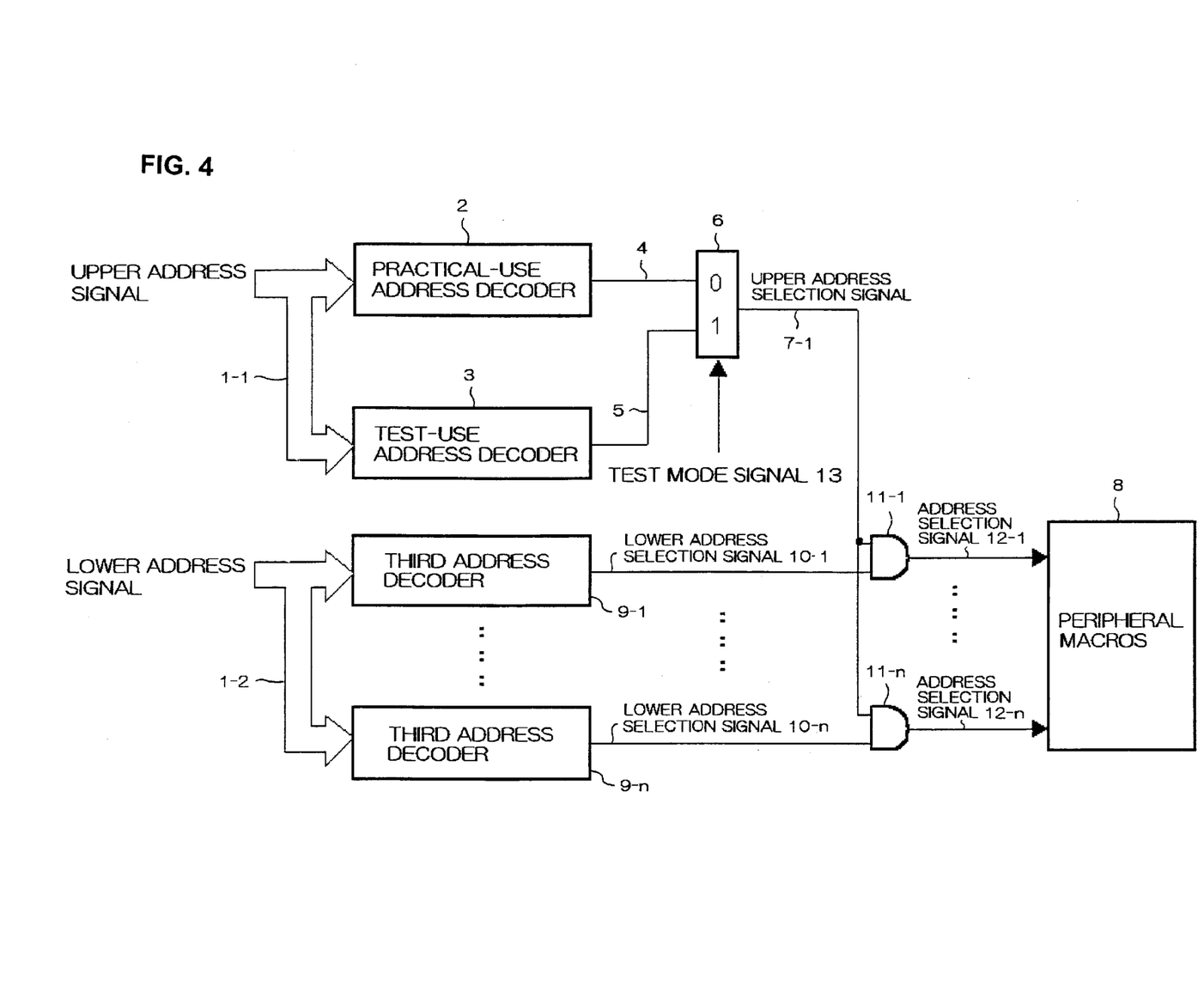
FIG. 4 is a block diagram of an address decoding circuit in accordance with the third embodiment.

FIG. 4 is a block diagram of an address decoding circuit in accordance with the third embodiment. In the instant embodiment, the peripheral macros 8 are equipped with a plurality of registers, in which case, the address decoding circuit in accordance with the above-mentioned first embodiment may be prepared by the number of the registers. However, it disadvantageously results in an increase in size of a whole circuit, and it is not efficient to prepare a plurality of the address decoding circuit in accordance with the first embodiment. Hence, an address decoding circuit in accordance with the third embodiment is designed to have such a structure as mentioned hereinbelow.

In the third embodiment, an address signal is comprised of an upper address signal and a lower address signal, each of which is decoded independently of one another, unlike the first embodiment.

The address decoding circuit in accordance with the third embodiment is comprised of a first or practical-use address decoder 2 which receives the upper address signal as the first address signal through a first address bus 1-1, compares the thus received upper address signal to a certain address, and transmits a first coincidence signal 4 only when the upper address signal is coincident with the certain address, a second or test-use address decoder 3 which receives the upper address signal as the first address signal through the first address bus 1-1, compares the thus received upper address signal to a certain address, and transmits a second coincidence signal 5 only when the upper address signal is coincident with the certain address, a selector 6 which receives the first and second coincidence signals 4 and 5 and a test mode signal 13, selects one of the first and second coincidence signals 4 and 5 in accordance with the received test mode signal 13, and transmits the thus selected coincidence signal 4 or 5 as an upper address selection signal 7-1 to peripheral macros 8, a plurality of third address decoders 9-1 to 9-n, and a plurality of logic AND circuits 11-1 to 11-n.

The test mode signal 13 transmitted to the selector 6 is a binary signal having two values "0" and "1". The test mode signal 13 having a value "1" is indicative of a test mode, and the test signal 13 having a value "0" is indicative of modes other than the test mode.

Each of the third address decoders 9-1 to 9-n receives a lower address signal as a second address signal through a second address bus 1-2, decodes the thus received lower address signal, and transmits a lower address selection signal 10-1 to 10-n.

The number "n" of the third address decoders 9-1 to 9-n and the number "n" of the logic AND circuits 11-1 to 11-n are both equal to the number of registers equipped in the peripheral macros 8.

The upper address selection signal 7-1 and one of the lower address selection signals 10-1 to 10-n are input into an associated one of the logic OR circuits 11-1 to 11-n. For instance, the upper address selection signal 7-1 AND the lower address selection signal 10-1 are input into the associated logic AND circuit 11-1.

Hereinbelow is explained an operation of the address decoding circuit illustrated in FIG. 4.

The upper address signal introduced into the practical-use address decoder 2 and the test-use address decoder 3 through the first address bus 1-1 is compared to a certain address in each of the practical-use address decoder 2 and the test-use address decoder 3. The practical-use address decoder 2 and the test-use address decoder 3 transmit the first and second coincidence signals 4 and 5, respectively, only when the received upper address signal is coincident with the certain address.

The selector 6 selects the first coincidence signal 4 when the received test mode signal 13 has a value "0" indicative of modes other than a test mode, or the second coincidence signal 5 when the received test mode signal 13 has a value "1" indicative of a test mode, and transmits the thus selected coincidence signal 4 or 5 to the logic AND circuits 11-1 to 11-n as the upper address selection signal 7-1.

The lower address signal introduced into the third address decoders 9-1 to 9-n through the second address bus 1-2 is decoded in each of the third address decoders 9-1 to 9-n, and then, is transmitted to the associated logic AND circuit 11-1 to 11-n as the lower address selection signal 10-1 to 10-n.

Each of the logic AND circuits 11-1 to 11-n makes logical sum of the upper address selection signal 7-1 and each one of the lower address selection signals 10-1 to 10-n, and transmits the thus logically summed signals to the peripheral macros 8 as an address selection signal 12-1 to 12-n, respectively. A desired register equipped in the peripheral macros 8 is selected in accordance with each one of the address selection signals 12-1 to 12-n.

In accordance with the above-mentioned third embodiment, decoding results only of the upper address signals are switched in the practical-use address decoder 2 and the test-use address decoder 3. Hence, the address decoding circuit in accordance with the third embodiment provides the same advantages as those provided by the address decoding circuit in accordance with the first embodiment.

In addition, the address decoding circuit in accordance with the third embodiment provides an additional advantage that it is possible to make access to a plurality of registers equipped in the peripheral macros 8 only by adding the test-use address decoder 3 and the selector 6 thereto.

Fourth Embodiment

Figure 5:
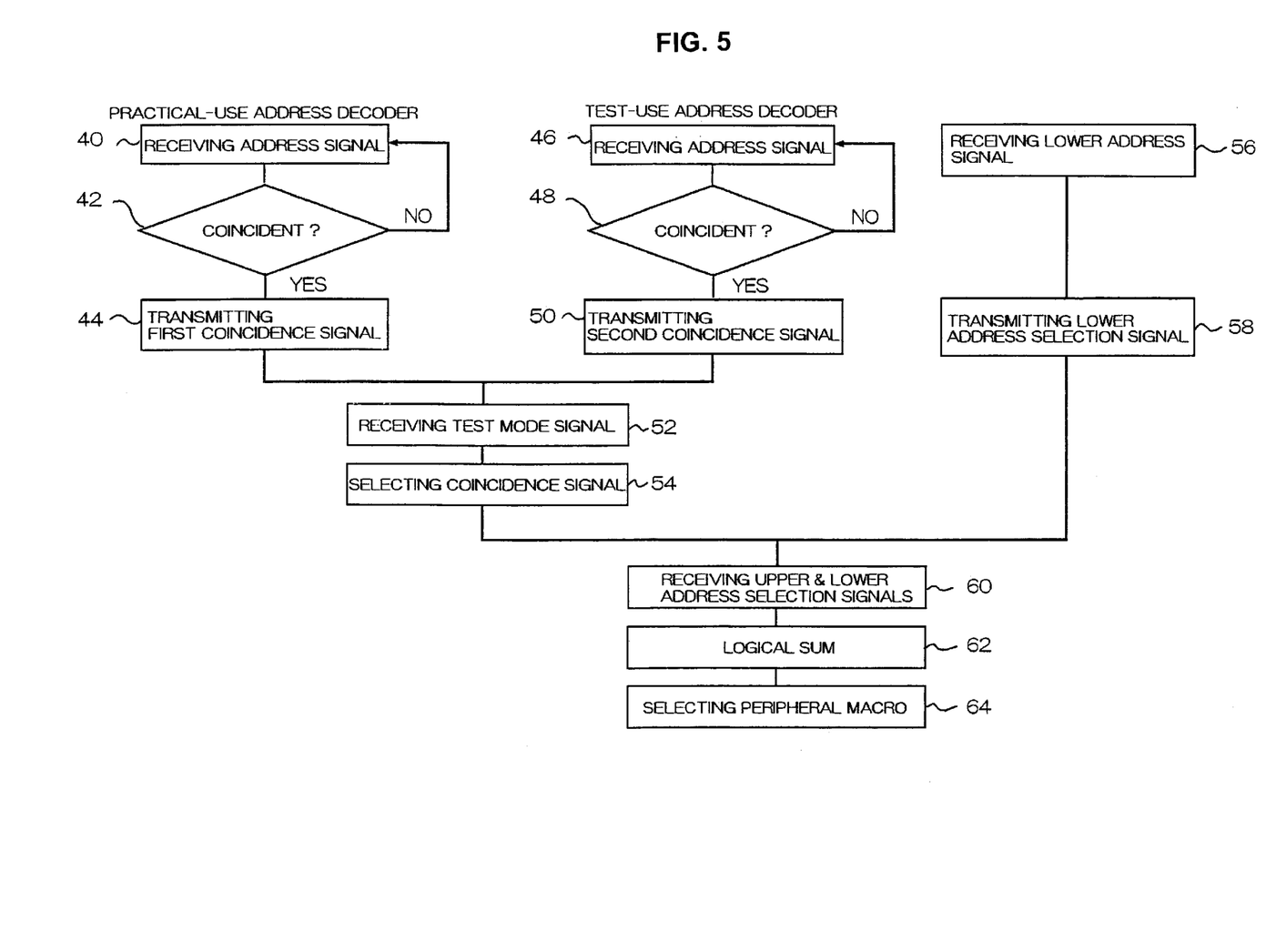
FIG. 5 is a flow chart of a method of address decoding in accordance with fourth embodiment.

FIG. 5 is a flow chart of a method of address decoding in accordance with the fourth embodiment.

First, as shown in step 40, an upper address signal is received in the practical-use address decoder 2.

Then, as shown in step 42, the practical-use address decoder 2 compares the received upper address signal to a certain address to determine whether they are coincident with each other.

If not (NO in step 42), comparison is ceased, and the practical-use address decoder 2 waits a next upper address signal.

If the received upper address signal is coincident with the certain address (YES in step 42), the practical-use address decoder 2 transmits the first coincidence signal 4, as shown in step 44.

The test-use address decoder 3 carries out the same steps as the steps carried out by the practical-use address decoder 2. Specifically, as shown in step 46, an upper address signal is received in the test-use address decoder 3.

Then, as shown in step 48, the test-use address decoder 3 compares the received upper address signal to a certain address to determine whether they are coincident with each other.

If not (NO in step 48), comparison is ceased, and the test-use address decoder 3 waits a next upper address signal.

If the received upper address signal is coincident with the certain address (YES in step 48), the test-use address decoder 3 transmits the third coincidence signal 5, as shown in step 50.

After receiving the first and second coincidence signals 4 and 5, the selector 6 receives the test mode signal 13 having a value "0" or "1", as shown in step 52.

As shown in step 54, the selector 6 selects the first coincidence signal 4 when the received test mode signal 13 has a value "0", and selects the second coincidence signal 5 when the received test mode signal 13 has a value "1".

The thus selected coincidence signal 4 or 5 is transmitted to each of the logic AND circuits 11-1 to 11-n as the upper address selection signal 7-1, as shown in step 60.

As shown in step 56, each of the third address decoders 9-1 to 9-n receives a lower address signal, decodes the thus received lower address signal, and transmits the thus decoded lower address signal to the logic AND circuits 11-1 to 11-n as the lower address selection signal 10-1 to 10-n, as shown in step 58.

Each of the logic AND circuits 11-1 to 11-n makes logical sum of the upper address selection signal 7-1 and an associated one of the lower address selection signals 10-1 to 10-n, as shown in step 62.

The thus made logical sum is transmitted to the peripheral macros 8 as the address selection signals 12-1 to 12-n, and as a result, a desired one of registers equipped in the peripheral macros 8 is selected, as shown in step 64.

A group of the steps 40, 42 and 44 carried out by the practical-use address decoder 2, a group of the steps 46, 48 and 50 carried out by the test-use address decoder 3, and a group of the steps 56 and 58 carried out by the third address decoders 9-1 to 9-n may be concurrently carried out. As an alternative, any two groups may be concurrently carried out. As an alternative, those three groups may be separately carried out, in which case, the groups may be carried out in any order.

While the present invention has been described in connection with the preferred embodiments, the present invention provides advantages as follows.

In accordance with the present invention, decoding result of an address used for a test, which is particular to peripheral macros, is selected in a test mode in accordance with the test mode signal. Hence, when peripheral macros are mounted on different chips, it would be possible to use a common vector, even if a practical-use address is changed. This ensures reduction in steps of re-constructing test vector.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-104233 filed on Apr. 15, 1998 including specification, claims, drawings and summary is incorporated herein by reference in its entirety.

What is claimed is:

1. An address decoding circuit comprising:

(a) a first address decoder for practical use for decoding an address which is particular to an individual object;

(b) a second address decoder for test use for decoding a constant address regardless of objects; and (c) a logic circuit receiving a selection signal, switching from decoding result transmitted thereto from said first address decoder to decoding results transmitted thereto from said second address decoder, and vice versa in accordance with said selection signal and transmitting the decoding result switched in accordance with said selection signal as an address selection signal to one of a plurality of peripheral macros.

2. An address decoding circuit comprising:

(a) a first address decoder receiving an address signal, comparing the thus received address signal to a certain address, and transmitting a first coincidence signal only when said address signal is coincident with said certain address;

(b) a second address decoder receiving an address signal, comparing the thus received address signal to a certain address, and transmitting a second coincidence signal only when said address signal is coincident with said certain address; and (c) a selector receiving a selection signal, selecting one of said first and second coincidence signals in accordance with the received selection signal, and selecting one of a plurality of peripheral macros in accordance with the thus selected coincidence signal.

3. The address decoding circuit as set forth in claim 2, wherein said first address decoder is an address decoder for practical use for decoding an address which is particular to an individual object, and said second address decoder is an address decoder for test use for decoding a constant address regardless of objects.

4. The address decoding circuit as set forth in claim 2, wherein said selection signal is a binary signal having "0" and "1".

5. An address decoding circuit comprising:

(a) a first address decoder receiving a first address signal, comparing the thus received first address signal to a certain address, and transmitting a first coincidence signal only when said first address signal is coincident with said certain address;

(b) a second address decoder receiving said first address signal, comparing the thus received first address signal to a certain address, and transmitting a second coincidence signal only when said first address signal is coincident with said certain address;

(c) a selector receiving a selection signal, selecting one of said first and second coincidence signals in accordance with the received selection signal, and transmitting the thus selected coincidence signal as a first address selection signal;

(d) at least one third address decoder receiving a second address signal, decoding the thus received second address signal, and transmitting a second address selection signal; and (e) at least one logic circuit each receiving said first and second address selection signals, logically summing said first and second address selection signals, and selecting one of a plurality of peripheral macros in accordance with the result of logically summing said first and second address selection signals.

6. The address decoding circuit as set forth in claim 5, wherein the number of said third address decoder(s) is equal to the number of register(s) equipped in each of said peripheral macros.

7. The address decoding circuit as set forth in claim 5, wherein said first address decoder is an address decoder for practical use for decoding an address which is particular to an individual object, and said second address decoder is an address decoder for test use for decoding a constant address regardless of objects.

8. The address decoding circuit as set forth in claim 5, wherein said selection signal is a binary signal having "0" and "1".

9. A method of address decoding, comprising the steps of:

(a) receiving an address signal, comparing the thus received address signal to a certain address, and transmitting a first coincidence signal only when said address signal is coincident with said certain address in a first address decoder;

(b) receiving an address signal, comparing the thus received address signal to a certain address, and transmitting a second coincidence signal only when said address signal is coincident with said certain address in a second address decoder;

(c) receiving a selection signal, and selecting one of said first and second coincidence signals in accordance with said selection signal; and (d) selecting one of a plurality of peripheral macros in accordance with the thus selected coincidence signal.

10. The method as set forth in claim 9, wherein said steps (a) and (b) are concurrently carried out.

11. A method of address decoding, comprising the steps of:

(a) receiving a first address signal, comparing the thus received first address signal to a certain address, and transmitting a first coincidence signal only when said first address signal is coincident with said certain address in a first address decoder; (b) receiving said first address signal, comparing the thus received first address signal to a certain address, and transmitting a second coincidence signal only when said first address signal is coincident with said certain address in a second address decoder;

(c) receiving a selection signal, selecting one of said first and second coincidence signals in accordance with said selection signal, and transmitting the thus selected coincidence signal as a first address selection signal;

(d) receiving a second address signal, decoding the thus received second address signal, and transmitting a second address selection signal in a third address decoder;

(e) logically summing said first and second address selection signals;

(f) selecting one of a plurality of peripheral macros in accordance with the result of said step (e).

12. The method as set forth in claim 11, wherein said step (d) is carried out in a plurality of said third address decoders.

13. The method as set forth in claim 12, wherein each of a plurality of said third address decoders concurrently carried out said step (d).

14. The method as set forth in claim 11, wherein said steps (a) and (b) are concurrently carried out.

15. The method as set forth in claim 11, wherein said steps (a), (b) and (d) are concurrently carried out.

\* \* \* \* \*